(12) United States Patent
Lee

(10) Patent No.: US 12,707,896 B2
(45) Date of Patent: Aug. 11, 2026

(54) ELECTRONIC APPARATUS

(71) Applicant: Samsung Display Co., Ltd., Yongin-si (KR)

(72) Inventor: Sang Jin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 199 days.

(21) Appl. No.: 18/489,351

(22) Filed: Oct. 18, 2023

(65) Prior Publication Data

US 2024/0244981 A1 Jul. 18, 2024

(30) Foreign Application Priority Data

Jan. 12, 2023 (KR) ........................ 10-2023-0004548

(51) Int. Cl.

| | |
|---|---|
| ***H10N 39/00*** | (2026.01) |
| ***H04R 1/02*** | (2006.01) |
| ***H04R 17/00*** | (2006.01) |
| ***H10K 59/00*** | (2023.01) |
| ***H10K 59/124*** | (2023.01) |

(52) U.S. Cl.

CPC ............. *H10N 39/00* (2023.02); *H04R 1/028* (2013.01); *H04R 17/00* (2013.01); *H10K 59/124* (2023.02); *H10K 59/751* (2023.02); *H04R 2499/11* (2013.01); *H04R 2499/15* (2013.01)

(58) Field of Classification Search

CPC .............. H04M 1/0268; H04N 7/0155; H04N 2201/3273; H05K 9/0096; H05K 2201/10128; H01J 2329/92; H10K 59/1213

See application file for complete search history.

(56) References Cited

U.S. PATENT DOCUMENTS

| | | | | |
|---|---|---|---|---|
| 8,873,776 | B2 | 10/2014 | Kim et al. | |
| 9,490,308 | B2 | 11/2016 | Jeong et al. | |
| 10,504,936 | B2 | 12/2019 | Park et al. | |
| 2019/0139941 | A1* | 5/2019 | Tseng | H04M 1/0266 |
| 2021/0200366 | A1* | 7/2021 | Bok | H04R 7/04 |
| 2021/0405797 | A1* | 12/2021 | Bae | H10K 50/844 |
| 2022/0013595 | A1 | 1/2022 | Jo et al. | |
| 2022/0353613 | A1* | 11/2022 | Han | G06F 1/1605 |
| 2023/0217827 | A1* | 7/2023 | Kho | H04R 17/10 310/311 |
| 2024/0205612 | A1* | 6/2024 | Sung | H04R 17/00 |
| 2024/0224810 | A1* | 7/2024 | Lee | H10N 30/877 |
| 2024/0236584 | A1* | 7/2024 | Ha | H04R 17/00 |

FOREIGN PATENT DOCUMENTS

| | | | |
|---|---|---|---|
| KR | 1020120064984 | A | 6/2012 |
| KR | 102224743 | B1 | 3/2021 |
| KR | 1020220006686 | A | 1/2022 |
| KR | 102427697 | B1 | 8/2022 |

* cited by examiner

*Primary Examiner* — Oyesola C Ojo

(74) *Attorney, Agent, or Firm* — CANTOR COLBURN LLP

(57) ABSTRACT

An electronic apparatus includes a display panel including pixel units arranged in a display area and an opening area defined between the pixel units, and a sound module including piezoelectric elements overlapping the opening area in the display area, wherein each of the pixel units includes a transistor and a light emitting element electrically connected to each other, wherein the piezoelectric elements are arranged along a first direction and a second direction crossing the first direction within the display area.

20 Claims, 6 Drawing Sheets

ED
DA
NPXA
PXA
OPA
PXU
OL
EN2 EN1 MN CE EML AE PX-O PDL GV
SPC
GV
70
60
50
40
30
20
10
BL
ELA
CNE
E1
E2
UE
DP
SM
I
I'
D2 A2 G2 S2
D1 A1 G1 S1
RX PZ TX SD
E3
T2
E4
T1
SA
DR3

ELECTRONIC APPARATUS

This application claims priority to Korean Patent Application No. 10-2023-0004548, filed on Jan. 12, 2023, and all the benefits accruing therefrom under 35 U.S.C. § 119, the entire contents of which are hereby incorporated by reference.

BACKGROUND

(1) Field

The present disclosure relates to an electronic apparatus including a display panel and a sound module.

(2) Description of the Related Art

Multimedia electronic apparatuses, such as televisions, mobile phones, tablets, navigation devices, and game machines, may include a display panel for displaying an image and a sound module for outputting sound. The electronic apparatus may include a sound module mounted therein together with a display panel so that sound may be output without installing a sound device such as a separate speaker. Accordingly, user convenience may be increased.

SUMMARY

An electronic apparatus which includes a sound module mounted therein together with a display panel has spatial limitations within the electronic apparatus, such that there may be a problem in the arrangement of sound modules occupying a certain space within the electronic apparatus.

The present disclosure provides an electronic apparatus with improved sound output and haptic effects and improved degree of freedom of arrangement and location of sound modules.

An embodiment of the invention provides an electronic apparatus including a display panel including pixel units arranged in a display area and an opening area defined between the pixel units, and a sound module including piezoelectric elements overlapping the opening area, where each of the pixel units includes a transistor and a light emitting element electrically connected to each other, where the piezoelectric elements are arranged along a first direction and a second direction crossing the first direction within the display area.

Each of the piezoelectric elements may include a first electrode line, a second electrode line on the first electrode line, and a piezoelectric layer between the first electrode line and the second electrode line.

In an embodiment, each of the first electrode line and the second electrode line may include at least one of PEDOT:PSS, graphene, carbon nanotubes, metal nanowires, and liquid metal materials.

In an embodiment, the piezoelectric layer may include at least one of polyvinylidene fluoride (PVDF), lead zirconate titanate (PZT), graphene, zinc oxide (ZnO), and composite materials thereof.

In an embodiment, the sound module may further include a base part under the display panel and covering the piezoelectric elements.

In an embodiment, the base part may include at least one of polydimethylsiloxane (PDMS), polyethylene terephthalate (PET), polyurethane (PU), and polyimide (PI).

In an embodiment, each of the first electrode line and the second electrode line may be provided in plurality and overlapping in the display area, where the first electrode lines may extend along the first direction and may be arranged along the second direction, where the second electrode lines may extend along the second direction and may be arranged along the first direction.

In an embodiment, the piezoelectric layer of each of the piezoelectric elements may be corresponding to overlapping portions of the first electrode lines and the second electrode lines.

In an embodiment, the display panel may include a base layer on the sound module, the transistor on the base layer, the light emitting element on the transistor, and insulating layers between the base layer and the light emitting element, where the opening area may be defined through the base layer and the insulating layers.

In an embodiment, the display panel may further include grooves defined through at least one of the insulating layers, and the grooves surround the pixel units, respectively.

In an embodiment, the display panel may further include encapsulation films covering the pixel units, respectively, where the encapsulation films may be non-overlapping in the opening area.

In an embodiment, the encapsulation films may be in the grooves, respectively.

In an embodiment, the light emitting element included in each of the pixel units may be provided in plurality, where the light emitting elements may include first to third light emitting elements which output light of different colors from each other.

In an embodiment of the invention, an electronic apparatus includes a base layer including a display area in which an opening area is defined, pixel units spaced apart from each other on the display area with the opening area therebetween and each including a light emitting element, insulating layers between the base layer and the light emitting element, and a sound module under the base layer, where the sound module includes a base part supporting the base layer, and piezoelectric elements inside the base part to overlap the opening area, where grooves are defined in at least one of the insulating layers, and the grooves surround the pixel units, respectively.

In an embodiment, the opening area may be defined through the base layer and the insulating layers.

In an embodiment, the piezoelectric elements may be arranged along a first direction and a second direction crossing the first direction between the pixel units on the display area.

In an embodiment, each of the piezoelectric elements may include a first electrode line, a second electrode line on the first electrode line, and a piezoelectric layer between the first electrode line and the second electrode line.

In an embodiment, each of the first electrode line and the second electrode line includes at least one of PEDOT:PSS, graphene, carbon nanotubes, metal nanowires, and liquid metal materials.

In an embodiment, the piezoelectric layer may include at least one of PVDF, PZT, graphene, ZnO, and composite materials thereof.

In an embodiment, the base part may include at least one of PDMS, PET, PU, and PI.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
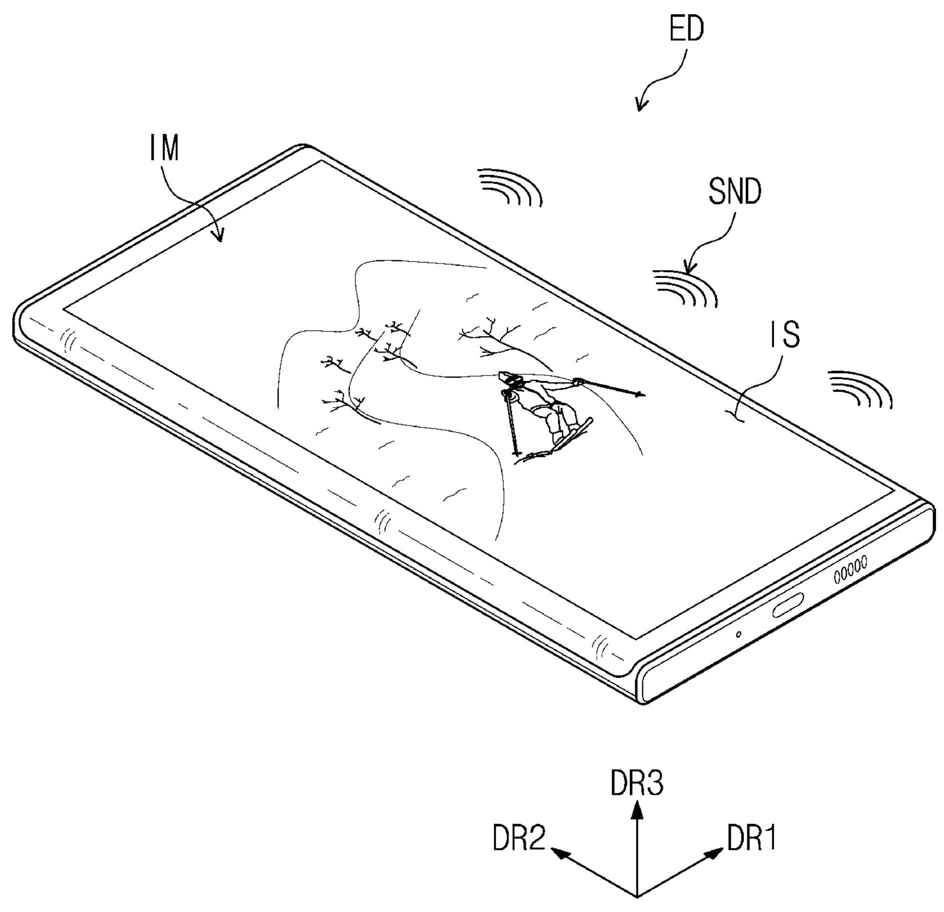
FIG. 1 is a perspective view of an electronic apparatus according to an embodiment of the invention.

Since the invention may have various changes and may have various forms, specific embodiments are illustrated in the drawings and described in detail in the text. However, this is not intended to limit the invention to specific embodiments, and should be understood to include all modifications, equivalents and substitutes included in the spirit and scope of the invention.

In this specification, when an element (or region, layer, part, etc.) is referred to as being related to another element such as being "on", "connected to", or "coupled to" another element, it means that it may be directly placed on/connected to/coupled to other components, or a third component may be arranged between them. In contrast, when an element (or region, layer, part, etc.) is referred to as being related to another element such as being "directly on", "directly connected to", or "directly coupled to" another element, it means that no third component is between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the invention.

The terms of a singular form may include plural forms unless otherwise specified. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." Within the Figures and the text of the disclosure, a reference number indicating a singular form of an element may also be used to reference a plurality of the singular element.

In addition, terms such as "below", "the lower side", "on", and "the upper side" are used to describe a relationship of components shown in the drawing. The terms are described as a relative concept based on a direction shown in the drawing.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this invention belongs. In addition, terms such as terms defined in commonly used dictionaries should be interpreted as having a meaning consistent with the meaning in the context of the related technology, and it should not be construed in an overly ideal or overly formal sense unless explicitly defined here.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an electronic apparatus ED according to an embodiment of the invention will be described with reference to the drawings.

Figure 2:
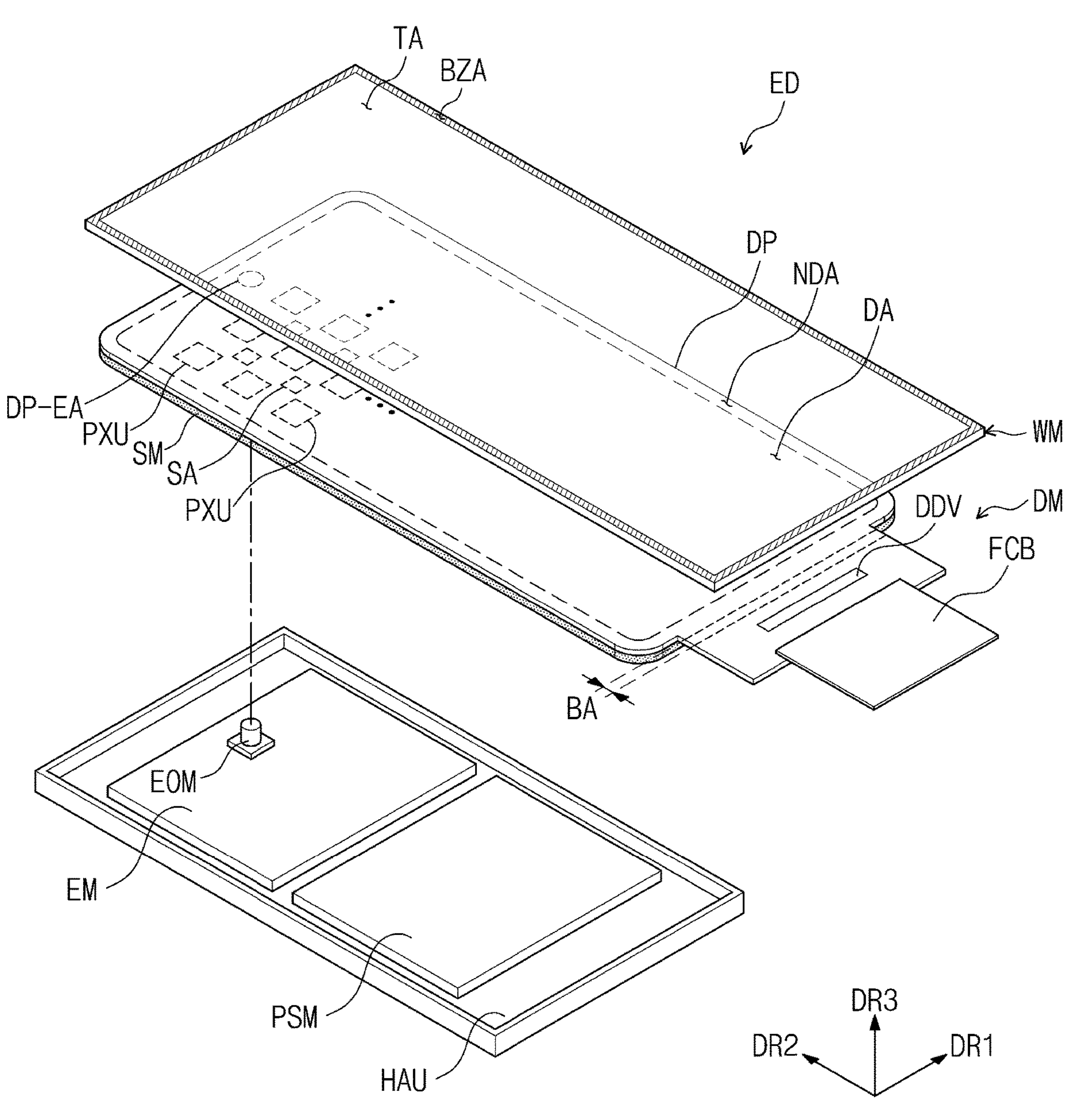
FIG. 2 is an exploded perspective view of an electronic apparatus according to an embodiment of the invention.
Figure 3:
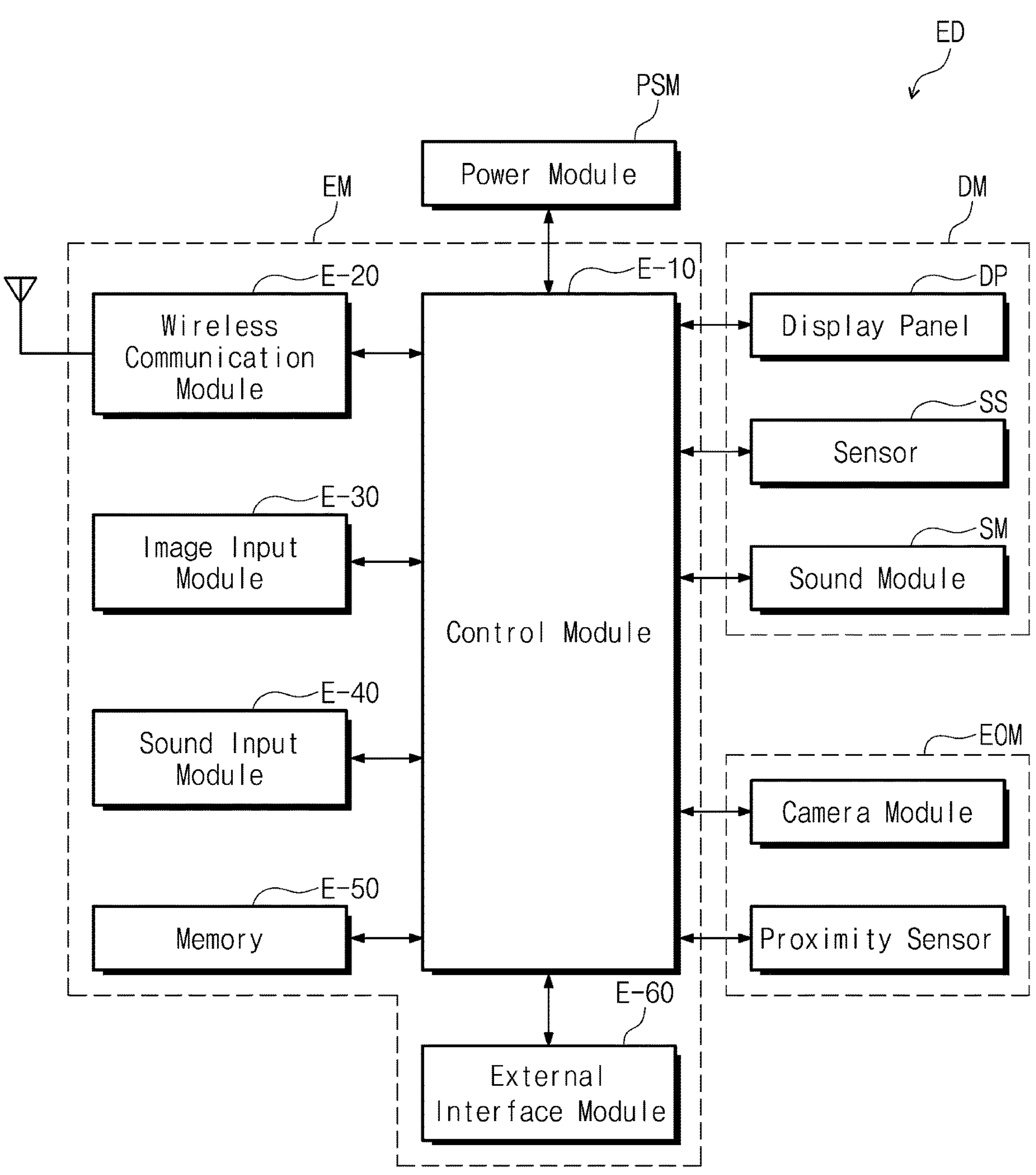
FIG. 3 is a block diagram of an electronic apparatus according to an embodiment of the invention.

FIG. 1 is a perspective view of an electronic apparatus ED according to an embodiment of the invention. FIG. 2 is an exploded perspective view of an electronic apparatus ED according to an embodiment of the invention. FIG. 3 is a block diagram of an electronic apparatus ED according to an embodiment of the invention.

Referring to FIG. 1, the electronic apparatus ED may be a device that is activated according to an electrical signal and displays an image IM. For example, the electronic apparatus ED may be a large device, such as a television or an external billboard, or a small or medium-sized device, such as a monitor, a mobile phone, a tablet, a navigation device, a game machine, and the like. However, the embodiments of the electronic apparatus ED are illustrative, and are not limited to any one unless departing from the concept of the invention. In this embodiment, the electronic apparatus ED exemplifies a mobile phone.

The electronic apparatus ED may have a rectangular shape having short sides extending in a first direction DR1 on a plane, and long sides extending in a second direction DR2 intersecting the first direction DR1. However, the invention is not limited thereto, and the electronic apparatus ED may have various shapes, such as a circle or a polygon on a plane.

In the present embodiment, the third direction DR3 may be defined as a direction perpendicular or normal to a plane defined by the first direction DR1 and the second direction DR2 crossing each other. The front (or upper surface) and the rear (or lower surface) of each member constituting the electronic apparatus ED may be opposite to each other in the third direction DR3, and a normal direction of each of the front surface and the rear surface may be substantially parallel to the third direction DR3. A separation distance between the front surface and the rear surface defined along the third direction DR3 may correspond to the thickness of the member. The third direction DR3 may define a thickness direction of the electronic apparatus ED and various components or layers thereof.

In the present specification, "on the plane" or "in the plan view" may be defined as a state viewed from or along the third direction DR3. In this specification, "on the cross-section" may be defined as a state viewed from the first direction DR1 and/or the second direction DR2. Moreover, the directions indicated by the first to third directions DR1, DR2, and DR3 are relative concepts and may be converted to other directions.

The electronic apparatus ED may be rigid or flexible. "Flexible" refers to a property that the electronic apparatus ED and various components or layers thereof may be bendable such as to be bent. The electronic apparatus ED which is "flexible" may include everything from a completely foldable structure to a structure that may be bent to the level of several nanometers. For example, a flexible electronic apparatus ED may include a curved device, a slidable device, a rollable device, or a foldable device. Various components or layers of the electronic apparatus ED may be bendable, curvable, slidable, rollable, foldable, etc. together with each other.

The electronic apparatus ED may display the image IM through a display surface IS. The display surface IS may correspond to the front surface of the electronic apparatus ED. The display surface IS of the electronic apparatus ED may include or be parallel to a plane on which the first and second directions DR1 and DR2 are defined, and display the image IM in a third direction DR3 crossing the plane. The image IM may include a dynamic image as well as a static image.

The electronic apparatus ED may output sound SND (or audio such as an audio signal) forward along with the image IM, from the display surface IS. The electronic apparatus ED according to an embodiment may output sound SND in the third direction DR3 through or at the entire area of to the display surface IS. In addition, the electronic apparatus ED may vibrate in response to the sound SND which is output, such as vibrating at an area where the sound SND is output. The area of the electronic apparatus ED to which sound SND and vibration are transmitted may be set in various ways according to the arrangement of a sound module SM (see FIG. 2), and this will be described in detail later.

The electronic apparatus ED according to an embodiment may detect an external input applied from the outside of the electronic apparatus ED. The external input may include various types of inputs, such as force, pressure, temperature, and light. The external input may include an input applied in close proximity to the electronic apparatus ED (e.g., hovering) as well as an input contacting the electronic apparatus ED (e.g., contact by an input tool such as a user's hand or a pen).

The electronic apparatus ED may detect a user's input through a display surface IS defined on the front side, and respond to the detected input signal. However, the area of the electronic apparatus ED that detects an external input is not limited to the front of the electronic apparatus ED and may be changed according to the design of the electronic apparatus ED. For example, the electronic apparatus ED may detect a user's input applied to the side or rear surface of the electronic apparatus ED.

Referring to FIGS. 1 to 3, the electronic apparatus ED may include a window WM, a display module DM, a sound module SM as a sound-generating layer, an electronic module EM as an image-generating layer, an electro-optical module EOM, a power module PSM, and a housing HAU.

The display module DM may display an image IM and detect an external input. The display module DM may include the display panel DP, and may further include at least one component disposed above or below the display panel DP. For example, the display module DM may include a display panel DP, a sensor SS, and a sound module SM. For convenience of illustrate, FIG. 2 briefly illustrates only the stacked structure of the display panel DP and the sound module SM among the components of the display module DM.

The window WM may be disposed on the display module DM, such as to face the display module DM. The window WM may be coupled to the display module DM, such as through an adhesive layer, but is not limited thereto. The window WM covers the front surface of the display module DM and may protect the display module DM from external shocks and scratches.

The window WM may include an optically transparent insulating material. For example, the window WM may include a glass film or a synthetic resin film as a base film. The window WM may have a single-layered or multi-layered structure. For example, the window WM may include a plurality of synthetic resin films bonded together with an adhesive, or may include a glass film and a synthetic resin film bonded together with an adhesive. The window WM may further include a functional layer such as an anti-fingerprint layer, a phase control layer, and a hard coating layer disposed on the base film.

A front surface of the window WM may correspond to a front surface of the electronic apparatus ED. The front surface of the window WM may include a transmissive area TA and a bezel area BZA. The front surface of the window WM may define the display surface IS.

The transmissive area TA may be an optically transparent area. The transmissive area TA may transmit the image IM provided by the display panel DP, and the image IM may be viewable from outside the electronic apparatus ED through the transmissive area TA. In this embodiment, the transmissive area TA is shown in a rectangular shape (e.g., a planar shape of a rectangle), but the transmissive area TA may have various shapes and is not limited to any one embodiment.

The bezel area BZA may be adjacent to the transmissive area TA. The planar shape of the transmissive area TA may be substantially defined by the bezel area BZA. For example, the bezel area BZA may be disposed outside the transmissive area TA, such as closer to an outer edge of the electronic apparatus ED, to surround the transmissive area TA. However, this is shown as an example, and the bezel area BZA may be adjacent to only one side of the transmissive area TA or may be omitted. In addition, the bezel area BZA may be disposed on the side of the electronic apparatus ED instead of the front.

The bezel area BZA may be an area (e.g., a planar area) having low light transmittance compared to the transmissive area TA. The bezel area BZA may correspond to an area on which a material having a predetermined color is provided, such as by printing. The bezel area BZA may prevent light from being transmitted, and thus one configuration of the display module DM disposed to overlap the bezel area BZA may be prevented from being visually recognized from the outside.

The display panel DP may be disposed between the window WM and the housing HAU. The display panel DP may display an image IM according to an electrical signal. The display panel DP according to an embodiment may be a light emitting display panel, but is not particularly limited thereto. For example, the display panel DP may be an organic light emitting display panel, an inorganic light emitting display panel, or a quantum dot light emitting display panel. The light emitting layer of the organic light emitting display panel may include an organic light emitting material, and the light emitting layer of the inorganic light emitting display panel may include an inorganic light emitting material. The light emitting layer of the quantum dot light emitting display panel may include quantum dot, quantum rod, and the like. Hereinafter, the display panel DP is described as the organic light emitting display panel.

The display panel DP may include a display area DA and a non-display area NDA. The display area DA may overlap at least a portion of the transmissive area TA and may be an area where the image IM is displayed. The non-display area NDA may overlap at least a portion of the bezel area BZA and may be an area where the image IM is not displayed.

The display area DA may be an area where the pixel units PXU are disposed. The pixel units PXU may be groups set according to the arrangement area and emission color of the light emitting elements OL included in the display panel DP. The pixel units PXU may be arranged along one direction within the display area DA. Light emitting elements OL constituting the pixel units PXU may be elements that generate and/or emit light in response to electrical signals, such as organic light emitting elements, inorganic light emitting elements, micro light emitting diodes (LEDs), or nano LEDs. The display panel DP may output the image IM within the display area DA, through activation, operation, control and/or driving of the pixel units PXU.

A part of the display area DA may be defined as a sensing area DP-EA. The sensing area DP-EA overlaps the electro-optical module EOM and may be a planar area having a relatively high optical signal transmittance among a total planar area of the display area DA. That is, the sensing area DP-EA may transmit an optical signal at a high rate while displaying the image IM. For example, light emitting elements OL may also be disposed in the sensing area DP-EA. A density of light emitting elements OL disposed in the sensing area DP-EA may be smaller than a density of light emitting elements OL disposed in the display area DA other than (or except for) the sensing area DP-EA. That is, the resolution of the sensing area DP-EA may be lower than the resolution of a remaining planar area of the display area DA which excludes the sensing area DP-EA.

Although FIG. 2 illustrates one sensing area DP-EA, the number of sensing areas DP-EA is not limited thereto. In addition, although FIG. 2 illustratively shows that the sensing area DP-EA is surrounded by a remaining planar area of the display area DA, it is not limited thereto, and a portion of the sensing area DP-EA is within the non-display area NDA may be defined.

The non-display area NDA may be adjacent to the display area DA. For example, the non-display area NDA may surround the display area DA. However, the invention is not limited thereto, and the non-display area NDA may be defined in various shapes. The non-display area NDA may be an area (e.g., a planar area) where a driving circuit for driving the pixel units PXU disposed in the display area DA, signal lines providing electrical signals to the pixel units PXU, and pads are disposed. Components disposed in the non-display area NDA may be prevented from being viewed from the outside by the bezel area BZA. Various components or layers of the electronic apparatus ED may include a transmissive area TA, a bezel area BZA, a display area DA, a non-display area NDA, a sensing area DP-EA, etc. corresponding to those described above.

The sound module SM may be disposed below the display panel DP. For example, the sound module SM may be coupled to the display panel DP at the rear surface of the display panel DP. The sound module SM may output sound SND in response to an electrical signal applied to the sound module SM and/or may provide vibration along with the output of the sound SND.

The sound module SM may be disposed overlapping the display area DA. The sound module SM may include piezoelectric elements SD (see FIG. 5) disposed to overlap the display area DA. In this embodiment, planar areas where piezoelectric elements SD (see FIG. 5) of the sound module SM are disposed may be defined as sound areas SA. The sound module SM may output the sound SND through the sound areas SA and may provide vibration according to an embodiment. The vibration may be provided to the sound areas SA of the display area DA, without being limited thereto.

The sound areas SA may be disposed corresponding to planar areas between the pixel units PXU, in the display area DA. The sound areas SA may be arranged along one direction within the display area DA. The sound areas SA are not limited to a specific area within the display area DA and may be uniformly disposed over an entirety of the display area DA. Accordingly, the electronic apparatus ED may provide realistic sound SND to outside the electronic apparatus ED, such as to the user. In addition, the electronic apparatus ED may transmit vibrations in response to the output sound SND at substantially an entirety of the display area DA to provide auditory and tactile stimulation to the user at the same time as sound is provided, to have an improved haptic effect.

In addition, according to the arrangement of the pixel units PXU within the display area DA, the arrangement positions of the sound areas SA may be set in various ways. The sound module SM may be disposed overlapping the display panel DP, and depending on the embodiment, the sound module SM may be disposed to overlap the entire area of the display area DA. Accordingly, the degree of freedom of placement of the sound module SM within the electronic apparatus ED may be improved.

The electronic apparatus ED may include a flexible circuit board FCB electrically connected to the display panel DP. The flexible circuit board FCB may be disposed on the non-display area NDA and coupled to the display panel DP at the non-display area NDA. The flexible circuit board FCB may be electrically connected to the electronic module EM at a main circuit board constituting the electronic module EM, without being limited thereto.

A portion of the non-display area NDA of the display panel DP which is adjacent to (or closest to) the flexible circuit board FCB may be defined as a bending area BA. The display panel DP may be bendable at the bending area BA to be bent around a bending axis extended parallel to the first direction DR1. As the bending area BA is bent, the flexible circuit board FCB connected to the display panel DP may overlap a portion of the display panel DP corresponding to the display area DA on a plane. That is, the display panel DP which is bent includes the flexible circuit board FCB overlapping the display area DA, along a thickness direction of the display panel DP which is bent.

The display panel DP may include a data driver DDV disposed in a non-display area NDA. The data driver DDV may include a data driving circuit for driving the pixel units PXU. In one embodiment, the data driver DDV may be provided in the form of an integrated circuit chip mounted in a non-display area NDA of the display panel DP. However, the data driver DDV is not limited thereto and according to embodiments, the data driver DDV may be mounted on a flexible circuit board FCB. The data driver DDV may be connected (e.g., electrically connected) the pixel units PXU to drive the pixel units PXU.

The window WM and the housing HAU may be combined with each other to form the outer appearance of the electronic apparatus ED. The display module DM, the electronic module EM, the electro-optical module EOM, and the power module PSM may be accommodated in an inner space formed by the window WM and the housing HAU being combined with each other.

The housing HAU may include a material having relatively high rigidity. For example, the housing HAU may include a plurality of frames and/or plates made of glass, plastic, or metal, or a combination thereof. The housing HAU may protect components of the electronic apparatus ED stored in the housing HAU, by absorbing shock applied from the outside or preventing foreign substances/moisture from penetrating from the outside.

Referring to FIG. 3, the sensor SS included in the display module DM may include at least one of an input sensor, an antenna sensor, and a fingerprint sensor. The sensor SS may detect an external input and provide an input signal including information about the external input so that the display panel DP may display an image IM corresponding to the external input. The sensor SS may be driven in various ways, such as a capacitance method, a resistive film method, an infrared method, a sound wave method, or a pressure method, but is not limited to any one.

The sensor SS may be disposed above or below the display panel DP. For example, the sensor SS may be provided in the form of a thin film stacked on the display panel DP. In an embodiment of a method of providing the electronic apparatus ED, the sensor SS may be formed on the display panel DP through a continuous process without a separate adhesive layer therebetween or may be coupled to the display panel DP through an adhesive layer.

The electronic module EM may include a control module E-10, a wireless communication module E-20, an image input module E-30, a sound input module E-40, a memory E-50, and an external interface module E-60. The electronic module EM may include a main circuit board, and modules included in the electronic module EM may be mounted on the main circuit board or electrically connected to the main circuit board through a flexible circuit board. The electronic module EM may be electrically connected to the power module PSM.

The control module E-10 may control the overall operation of the electronic apparatus ED. For example, the control module E-10 may activate or deactivate the display module DM according to an input such as a user input. The control module E-10 may control the image input module E-30 and the sound input module E-40 according to an input such as the user input. The control module E-10 may include at least one microprocessor.

The wireless communication module E-20 may transmit/receive wireless signals to/from other terminals using a Bluetooth or Wi-Fi line. The wireless communication module E-20 may transmit/receive voice signals using a general communication line. The wireless communication module E-20 may include a plurality of antenna modules.

The image input module E-30 may process an image signal and convert the image signal into image data that may be displayed on the display module DM. The sound input module E-40 receives an external sound signal through a microphone in a recording mode or voice recognition mode and converts the received external sound signal into electrical voice data. The sound module SM may convert sound data received from the wireless communication module E-20 or sound data stored in the memory E-50 and output the sound data to the outside.

The external interface module E-60 may serve as an interface connected to an external charger, a wired/wireless data port, a card socket (e.g., a memory card, and a SIM/UIM card), or the like.

The power module PSM may supply power required for overall operation of the electronic apparatus ED. For example, the power module PSM may include a conventional battery device.

Referring to FIG. 2 together with FIG. 3, the electro-optical module EOM overlaps the sensing area DP-EA and may be disposed under the display module DM. The electro-optical module EOM may be an electronic component that receives an optical signal provided from the outside of the electronic apparatus ED or outputs an optical signal to the outside of the electronic apparatus ED, through the sensing region DP-EA. For example, an electro-optical module EOM which provides a function to the electronic apparatus ED may include a camera module and/or a proximity sensor. The camera module may be a module that captures an external image through the sensing area DP-EA. The proximity sensor may be a sensor that measures a distance between an object and the electronic apparatus ED by using information received through the sensing area DP-EA. However, the embodiment of the electro-optical module EOM is not limited thereto, and may further include a sensor that recognizes an external object such as a body part of a user' (e.g., a fingerprint, an iris, or a face) or a small lamp that outputs light.

Figure 4:
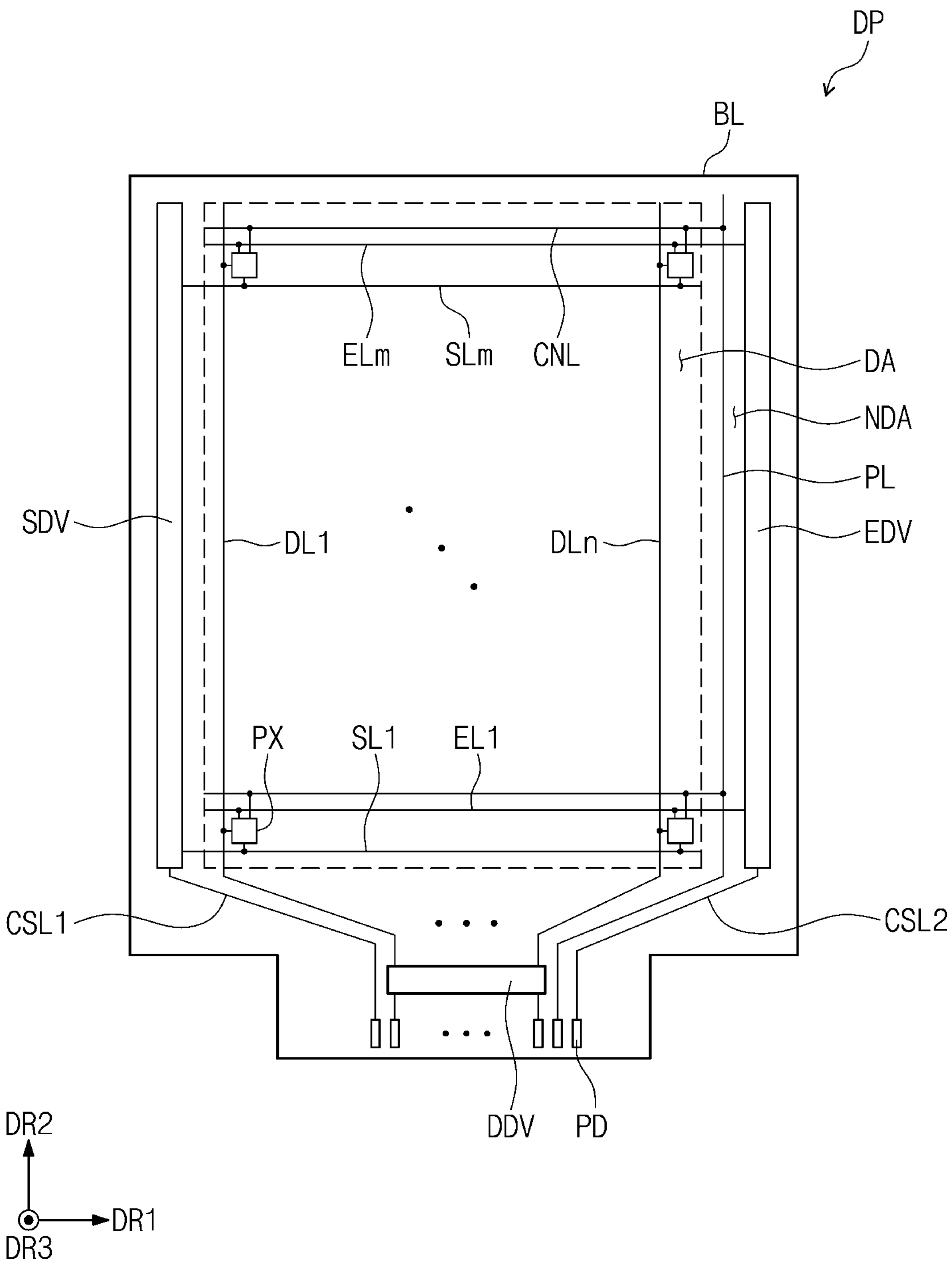
FIG. 4 is a plan view of a display panel according to an embodiment of the invention.

FIG. 4 is a plan view of a display panel DP according to an embodiment of the invention.

Referring to FIG. 4, the display panel DP may include a base layer BL as a first base layer of the electronic apparatus ED, pixels PX, signal lines SL1 to SLm, DL1 to DLn, EL1 to Elm, CSL1, CSL2, PL, and CNL electrically connected to the pixels PX, a scan driver SDV, a data driver DDV, and an emission driver EDV.

The base layer BL may provide a base surface on which elements and wirings of the display panel DP, the base surface being disposed on (or in) a plane parallel to each of the first and second directions DR1 and DR2. The base layer BL may include a display area DA and a non-display area NDA corresponding to the aforementioned display area DA and non-display area NDA of the display panel DP. An opening area OPA (see FIG. 6) to be described later may be defined in (or by) the base layer BL, in the display area DA, which will be described in detail later.

Pixels PX are arranged in the display area DA to display an image IM. The pixels PX may be grouped according to light emission colors to form the aforementioned pixel unit PXU (see FIG. 2). Each of the pixels PX may include a pixel driving circuit including a light emitting element OL, transistors (e.g., a switching transistor, a driving transistor, etc.) electrically connected to the light emitting element OL, and at least one capacitor. Each of the pixels PX may emit light having a color in response to an electrical signal applied to the pixels PX and display an image IM within the display area DA.

A scan driver SDV, a data driver DDV, and an emission driver EDV for driving the pixels PX may be disposed in the non-display area NDA. However, in order to reduce the planar area of the non-display area NDA, at least one of the scan driver SDV, the data driver DDV, and the emission driver EDV may be disposed in the display area DA.

The signal lines SL1 to SLm, DL1 to DLn, EL1 to Elm, CSL1, CSL2, PL, and CNL may include scan lines SL1 to SLm, data lines DL1 to DLn, emission lines EL1 to Elm, first and second control lines CSL1 and CSL2, a power line PL, and connection lines CNL. Here, 'm' and 'n' are natural numbers.

The data lines DL1 to DLn may be insulated from and cross the scan lines SL1 to SLm and the emission lines EL1 to Elm. For example, the scan lines SL1 to SLm may extend in the first direction DR1 to be electrically connected to the scan driver SDV. The data lines DL1 to DLn may extend in the second direction DR2 to be electrically connected to the data driver DDV. The emission lines EL1 to Elm may extend in the first direction DR1 to be electrically connected to the emission driver EDV.

The power line PL may extend in the second direction DR2 to be disposed in the non-display area NDA. The connection lines CNL extend in the first direction DR1 and are arranged along the second direction DR2 to be electrically connected to the power line PL and the pixels PX. Each of the connection lines CNL may be disposed on a different layer from the power line PL and electrically connected to the power line PL through a contact hole. However, the embodiment of the invention is not limited thereto, and the connection lines CNL and the power line PL may be integrally formed on (or in) the same layer as each other. The power voltage applied to the power line PL may be transmitted to the pixels PX through the connection lines CNL. As being in a same layer, elements may be formed in a same process and/or include a same material as each other, elements may be respective portions of a same material layer, elements may be on a same layer by forming an interface with a same underlying or overlying layer, etc., without being limited thereto.

The first control line CSL1 may be electrically connected to the scan driver SDV. The second control line CSL2 may be electrically connected to the emission driver EDV.

A pad PD provided in plural including a plurality of pads PD may be disposed adjacent to the lower end of the non-display area NDA. The pads PD may be disposed closer to the bottom edge of the display panel DP than the data driver DDV. The pads PD may be spaced apart from each other along the first direction DR1, such as along the bottom edge of the display panel DP.

Each of the pads PD may be connected to a corresponding signal line among the signal lines SL1 to SLm, DL1 to DLn, EL1 to Elm, CSL1, CSL2, PL, and CNL. For example, the power line PL, the first control line CSL1, and the second control line CSL2 may be electrically connected to the pads PD, and each of the data lines DL1 to DLn may be electrically connected to a corresponding pad PD through a data driver DDV. The pads PD may be portions of the display panel DP at which the aforementioned flexible circuit board FCB (see FIG. 2) is electrically connected to the display panel DP. Accordingly, an electrical signal provided from the flexible circuit board FCB (see FIG. 2) as an external device may be transferred to the display panel DP, through the pads PD.

A scan driver SDV may generate scan signals in response to a scan control signal. The scan signals as electrical signals may be applied to the pixels PX through the scan lines SL1 to SLm. The data driver DDV may generate data voltages corresponding to the image signals in response to the data control signal. The data voltages as electrical signals may be applied to the pixels PX through the data lines DL1 to DLn.

An emission driver EDV may generate emission signals in response to emission control signal. The emission signals as electrical signals may be applied to the pixels PX through the emission lines EL1 to Elm.

The pixels PX may be provided with the data voltages in response to the scan signals. The pixels PX may generate an image IM by emitting light having a luminance corresponding to the data voltages in response to the emission signals. The emission time of the pixels PX may be controlled by emission signals.

Figure 5:
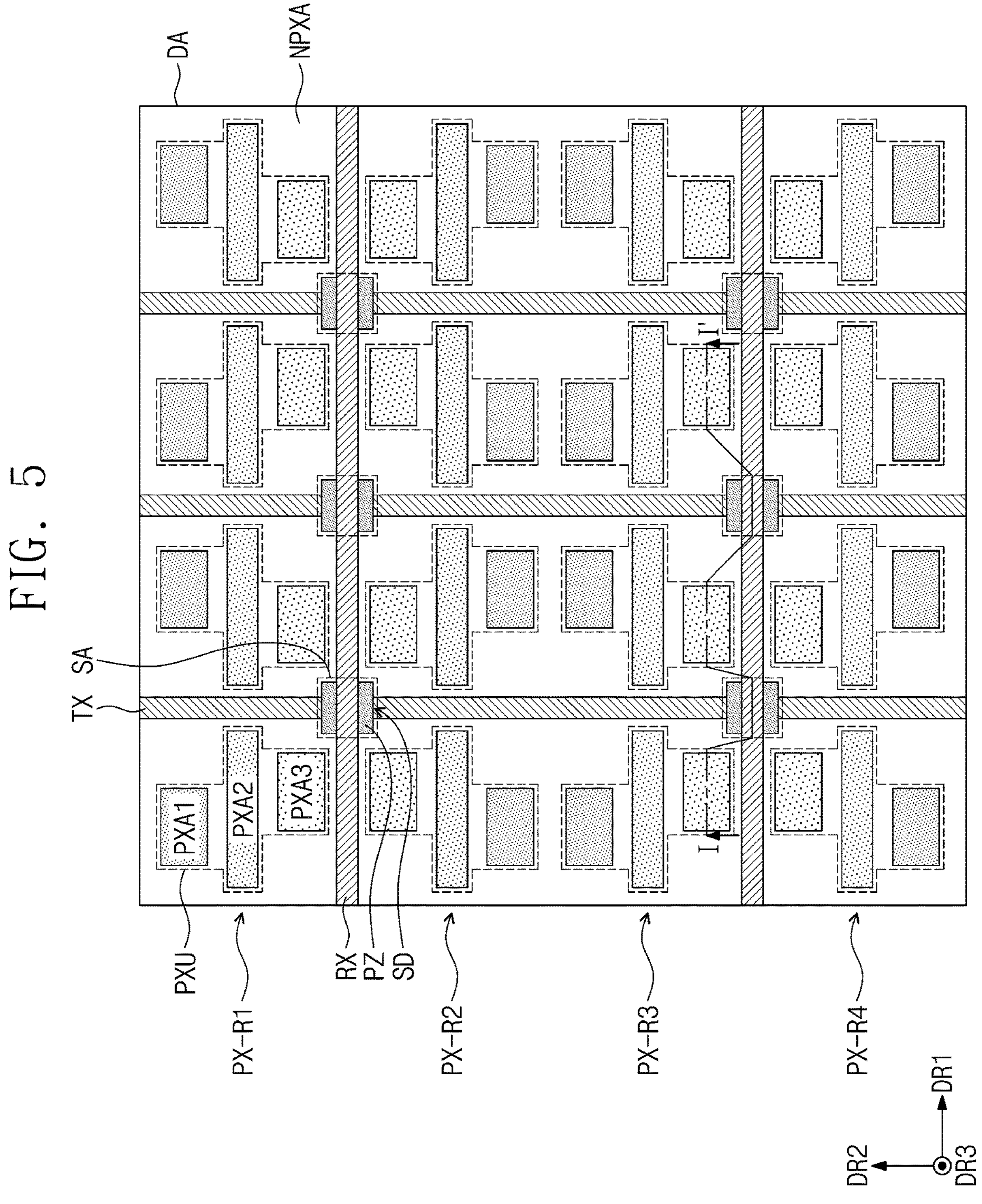
FIG. 5 is an enlarged plan view of an electronic apparatus according to an embodiment of the invention.

FIG. 5 is an enlarged plan view of an electronic apparatus ED according to an embodiment of the invention. FIG. 5 is an enlarged and simplified plan view corresponding to a part of the display area DA.

Referring to FIG. 5, pixel units PXU may be disposed in a display area DA. The pixel units PXU may be arranged along the first and second directions DR1 and DR2 within the display area DA.

Each of the pixel units PXU may include an emission area PXA provided in plural including a plurality of emission areas PXA1, PXA2, and PXA3. The emission areas PXA1, PXA2, and PXA3 may correspond to planar areas where light emitting elements OL are disposed. The emission areas PXA1, PXA2, and PXA3 may respectively correspond to light emitting elements OL of the aforementioned pixels PX (see FIG. 4). For example, the pixel units PXU may include first to third emission areas PXA1, PXA2, and PXA3.

The first to third emission areas PXA1, PXA2, and PXA3 may be classified according to emission colors of lights. For example, the first to third emission areas PXA1, PXA2, and PXA3 may emit red light, blue light, and green light, respectively. However, the color of light output through the first to third emission areas PXA1, PXA2, and PXA3 is not limited thereto.

Planar areas, planar shapes, and arrangement positions of the first to third emission areas PXA1, PXA2, and PXA3 may be designed in various ways depending on the color of the light emitted through the emission area PXA, the resolution of the electronic apparatus ED (see FIG. 1), the area of the display area DA, and the like. The areas, shapes, and arrangement positions of the first to third emission areas PXA1, PXA2, and PXA3 shown in FIG. 5 are exemplary, and areas, shapes, and arrangement positions of the first to third emission areas PXA1, PXA2, and PXA3 within the pixel units PXU may be provided in various ways.

At least two emission areas PXA among the first to third emission areas PXA1, PXA2, and PXA3 may have the same area (e.g., a same size planar area). However, the embodiment of the invention is not limited thereto, and all of the first to third emission areas PXA1, PXA2, and PXA3 may have different areas from each other.

On a plane, the first to third emission areas PXA1, PXA2, and PXA3 may have various shapes such as circular, elliptical, or polygonal shapes. FIG. 5 exemplarily illustrates first to third emission areas PXA1, PXA2, and PXA3 having a quadrangular shape.

Within one pixel unit PXU, arrangement positions of the first to third emission areas PXA1, PXA2, and PXA3 may be designed in various ways. Referring to FIG. 5, within one pixel unit PXU, the first emission area PXA1 and the third emission area PXA3 may be disposed with the second emission area PXA2 therebetween. The center of the first emission area PXA1 and the center of the third emission area PXA3 may be displaced from each other in the second direction DR2. However, the arrangement positions of the first to third emission areas PXA1, PXA2, and PXA3 are not limited to the illustrated embodiment.

The pixel units PXU arranged along the first direction DR1 may be defined as a pixel row. FIG. 5 illustrates four pixel rows PX-R1, PX-R2, PX-R3, and PX-R4. The pixel rows PX-R1, PX-R2, PX-R3, and PX-R4 may be arranged along the second direction DR2.

The pixel units PXU adjacent to each other in the first direction DR1 in each of the pixel rows PX-R1, PX-R2, PX-R3, and PX-R4 may have structures symmetrical to each other in the first direction DR1. Pixel units PXU adjacent to each other in the second direction DR2 between the pixel rows PX-R1, PX-R2, PX-R3, and PX-R4 may have structures symmetrical to each other in the second direction DR2. However, the embodiment of the invention is not necessarily limited thereto.

The display area DA may include a non-emission area NPXA. The non-emission area NPXA may be an area surrounding the emission areas PXA1, PXA2, and PXA3. The non-emission area NPXA sets boundaries between the emission areas PXA1, PXA2, and PXA3, and color mixing between the emission areas PXA1, PXA2, and PXA3 may be prevented. A portion of the non-emission area NPXA may be defined as including an opening area OPA (see FIG. 6), which will be described later, and thus, the pixel units PXU may be provided in an island shape. A boundary may be defined between pixel units PXU which are adjacent to each other, and the opening area OPA may be defined at the boundary. As being an island shape, elements or layers may have a discrete planar shape, such as to define a pattern of a respective layer.

The sound module SM (see FIG. 2) may be arranged to overlap the display area DA. The sound module SM (see FIG. 2) may include a plurality of piezoelectric elements SD. Each of the piezoelectric elements SD as a sound-generating element may include a first electrode line TX, a second electrode line RX, and a piezoelectric layer PZ disposed to overlap each other on a plane. An overlapping area may be defined by the first electrode line TX, the second electrode line RX, and the piezoelectric layer PZ which overlap each other. That is, the sound module SM (see FIG. 2) may include first electrode lines TX, second electrode lines RX, and piezoelectric layers PZ, and portions of the first electrode lines TX, the second electrode lines RX, and the piezoelectric layers PZ that respectively overlap each other may correspond to or define the piezoelectric elements SD. In an embodiment, for example, the first electrode lines TX and the second electrode lines RX overlap each other at a plurality of overlapping areas, and the piezoelectric layer PZ of each of the piezoelectric elements SD corresponds to an overlapping area among the plurality of overlapping areas.

Areas where the piezoelectric elements SD are disposed may be defined as sound areas SA. The sound areas SA may correspond to the overlapping areas of the piezoelectric elements SD. The sound areas SA are disposed between the pixel units PXU and may be arranged along the first and second directions DR1 and DR2 within the display area DA. The sound areas SA may be disposed with a uniform density within the display area DA. That is, the sound areas SA may not be densely arranged in a specific area of the display area DA. Through this, the electronic apparatus ED (see FIG. 1) may give a vibration effect to the position where sound is generated and provide realistic sound.

The sound areas SA may be spaced apart from the pixel units PXU on a plane. For example, the sound areas SA may not overlap the emission areas PXA1, PXA2, and PXA3 of the pixel units PXU. As the sound areas SA and the pixel units PXU are disposed not to overlap each other (e.g., be spaced apart from each other), it is possible to prevent deterioration in the output efficiency of sound and/or vibration through the sound areas SA and the output efficiency of the image IM through the pixel units PXU.

Each of the first electrode lines TX may extend along the second direction DR2, and the first electrode lines TX may be arranged spaced apart from each other along the first direction DR1. Each of the second electrode lines RX may extend along the first direction DR1, and the second electrode lines RX may be arranged along the second direction DR2. The first electrode lines TX and the second electrode lines RX may be disposed to cross each other on a plane, to define an intersection of the electrode lines.

Each of the piezoelectric layers PZ may be disposed between the first electrode lines TX and the second electrode lines RX along the third direction DR3. The piezoelectric layers PZ may be disposed at portions where the first electrode lines TX and the second electrode lines RX cross and overlap each other, that is, the intersection of the electrode lines. The first electrode line TX, the piezoelectric layer PZ, and the second electrode line RX may be disposed overlapping each other in that order, which may correspond to or define the piezoelectric element SD.

The first electrode lines TX and the second electrode lines RX may be spaced apart from the emission areas PXA1, PXA2, and PXA3 on a plane. However, the embodiment is not limited thereto, and at least a portion of the first electrode lines TX and the second electrode lines RX may be disposed to overlap the emission areas PXA1, PXA2, and PXA3.

Each of the piezoelectric layers PZ may be spaced apart from the emission areas PXA1, PXA2, and PXA3 on a plane. Each of the piezoelectric layers PZ may not overlap the emission areas PXA1, PXA2, and PXA3.

Figure 6:
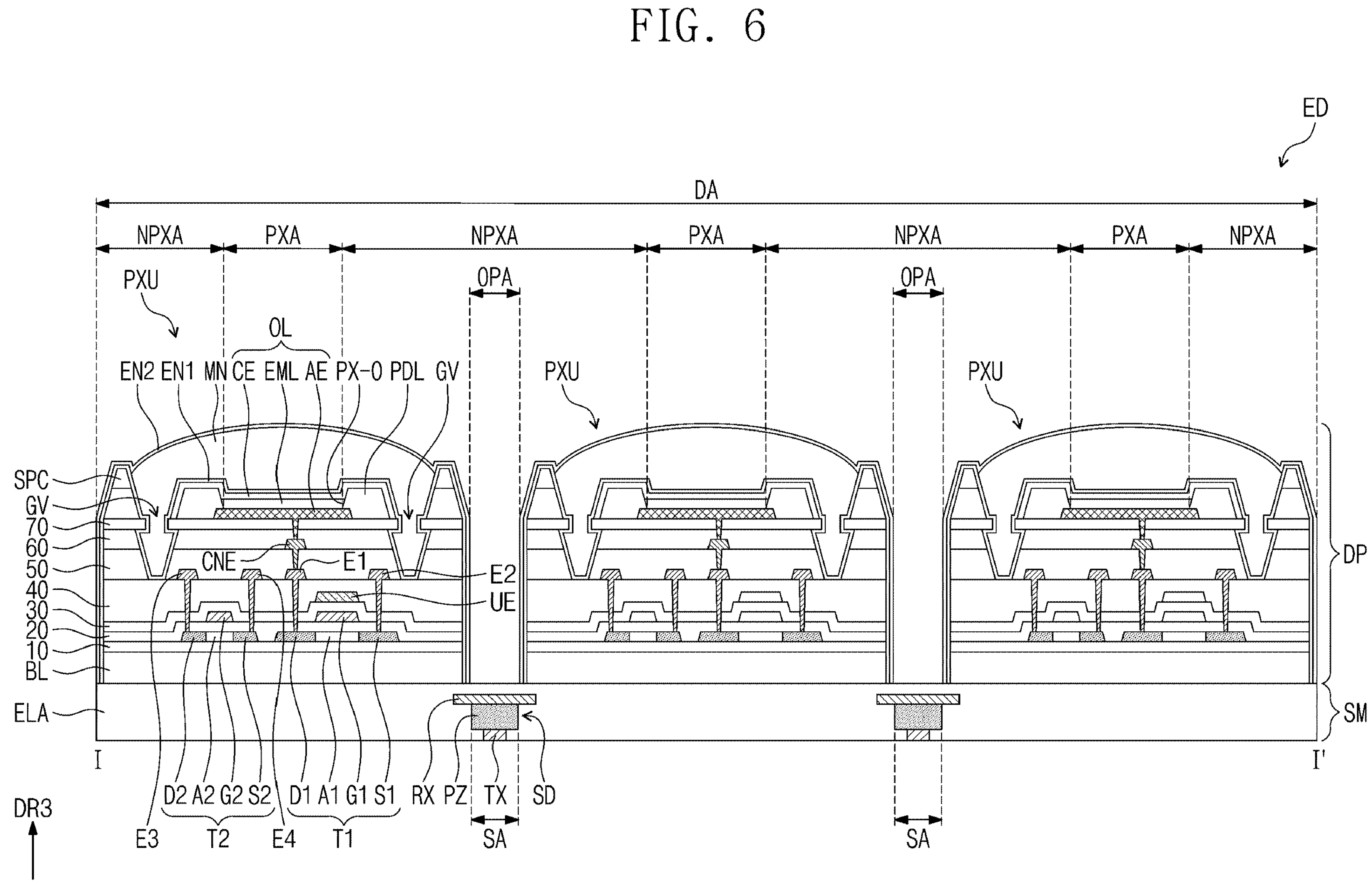
FIG. 6 is an enlarged cross-sectional view of an electronic apparatus according to an embodiment of the invention.

FIG. 6 is a cross-sectional view of an electronic apparatus ED according to an embodiment of the invention. FIG. 6 shows an enlarged cross section of an electronic apparatus ED corresponding to a partial area of the display area DA. The above description may be applied to each component of the electronic apparatus ED shown in FIG. 6.

Referring to FIG. 6, the display panel DP may include a base layer BL, insulating layers 10 to 70, pixel units PXU, a pixel defining film PDL, and encapsulation films EN1, MN, and EN2. The pixel units PXU may include a light emitting element OL and a transistor electrically connected to the light emitting element OL. FIG. 6 illustratively illustrates first and second transistors T1 and T2 electrically connected to the light emitting element OL.

The base layer BL may provide a base surface on which the pixel units PXU are disposed. The base layer BL may be a rigid substrate or a flexible substrate capable of bending, folding, rolling, or the like. The base layer BL may include a glass substrate, a metal substrate, or a polymer substrate. The base layer BL may have a single-layer or multi-layer structure, and may include an inorganic layer, a synthetic resin layer, or a combination thereof such as in composite material layer.

The insulating layers 10 to 70 may include first to seventh insulating layers 10 to 70 sequentially stacked on the base layer BL. The insulating layers 10 to 70 may be disposed between the base layer BL and the light emitting element OL in (or along) the thickness direction of the display panel DP. The insulating layers 10 to 70 may include at least one of an inorganic layer and an organic layer.

The first insulating layer 10 may be disposed on the base layer BL. The first insulating layer 10 may be provided as a buffer layer to improve bonding strength between the semiconductor patterns of the first and second transistors T1 and T2 and the base layer BL. The first insulating layer 10 may include an inorganic layer having a single-layer or multi-layer structure. For example, the first insulating layer 10 may include at least one of silicon oxide, silicon nitride, and silicon oxynitride.

The first and second transistors T1 and T2 may be disposed on the first insulating layer 10. Each of the first and second transistors T1 and T2 may include a semiconductor pattern and gate electrodes G1 and G2 disposed on the semiconductor pattern. Each of the semiconductor patterns of the first and second transistors T1 and T2 may include source regions S1 and S2, drain regions D1 and D2, and active regions A1 and A2. The semiconductor patterns of the first and second transistors T1 and T2 may include polysilicon, amorphous silicon, or metal oxide, but are not limited to any one as long as they have semiconductor properties.

The semiconductor patterns of the first and second transistors T1 and T2 may be respectively divided into a plurality of regions according to conductivity. For example, the semiconductor pattern may have different electrical properties depending on whether a material area and/or thickness portion is doped or whether metal oxide is reduced. A highly conductive region of the semiconductor pattern may serve as an electrode or a signal line, and may correspond to the source regions S1 and S2 and the drain regions D1 and D2 of the transistors T1 and T2. The non-doped or non-reduced regions having relatively low conductivity may correspond to the active regions A1 and A2 (or channel regions) of the transistors T1 and T2.

The second insulating layer 20 covers semiconductor patterns of the first and second transistors T1 and T2 and may be disposed on the first insulating layer 10. Gate electrodes G1 and G2 of the first and second transistors T1 and T2 may be disposed on the second insulating layer 20.

The gate electrode G1 of the first transistor T1 may overlap the active region A1 of the first transistor T1, and the gate electrode G2 of the second transistor T2 may overlap the active region A2 of the second transistor T2. In an embodiment of a method of providing the display panel DP, the gate electrodes G1 and G2 as conductive patterns may function as a mask in a process of doping a material layer for forming the semiconductor pattern.

The third insulating layer 30 covers the gate electrodes G1 and G2 and may be disposed on the second insulating layer 20. An upper electrode UE may be disposed on the third insulating layer 30. The upper electrode UE may overlap the gate electrode G1 of the first transistor T1. The upper electrode UE and the gate electrode G1 overlapping each other may form a capacitor.

The fourth insulating layer 40 covers the upper electrode UE and may be disposed on the third insulating layer 30. The drain electrodes E1 and E3 and the source electrodes E2 and E4 may be disposed on the fourth insulating layer 40. The drain electrodes E1 and E3 may be connected to the drain regions D1 and D2 of the first and second transistors T1 and T2, respectively, through contact holes penetrating the second to fourth insulating layers 20, 30, and 40. The source electrodes E2 and E4 may be connected to the source regions S1 and S2 of the first and second transistors T1 and T2, respectively, through contact holes penetrating the second to fourth insulating layers 20, 30, and 40.

The fifth insulating layer 50 may cover the drain electrodes E1 and E3 and the source electrodes E2 and E4 and may be disposed on the fourth insulating layer 40. A connection electrode CNE may be disposed on the fifth insulating layer 50. The connection electrode CNE may be connected to the drain electrode E1 through or at a contact hole penetrating the fifth insulating layer 50, and may be electrically connected to the drain region D1 of the first transistor T1 through the drain electrode E1.

The sixth insulating layer 60 covers the connection electrode CNE and may be disposed on the fifth insulating layer 50. The seventh insulating layer 70 may be disposed on the sixth insulating layer 60. At least one of the fifth insulating layer 50 and the sixth insulating layer 60 may include an organic layer, cover a step formed between components disposed thereunder, and provide a flat upper surface. The seventh insulating layer 70 may include an inorganic layer. However, the embodiment of the invention is not necessarily limited thereto.

A light emitting element OL and a pixel defining film PDL of a pixel defining layer may be disposed on the seventh insulating layer 70. The light emitting element OL may include a first electrode AE, a light emitting layer EML, and a second electrode CE.

The first electrode AE and the pixel defining film PDL may be disposed on the seventh insulating layer 70. The first electrode AE may be connected to the connection electrode CNE through a contact hole passing through the sixth and seventh insulating layers 60 and 70. The first electrode AE may be electrically connected to the drain region D1 of the first transistor T1, through the connection electrode CNE and the drain electrode E1.

An emission opening PX-O exposing at least a portion of the first electrode AE to outside the pixel defining layer may be defined in the pixel defining film PDL. An exposed portion of the first electrode AE which is exposed by the emission opening PX-O may be defined as or correspond to an emission area PXA. According to the arrangement of light emitting elements OL constituting the pixel unit PXU, the pixel unit PXU may include at least one emission area PXA. The emission area PXA of FIG. 6 may correspond to any one of the first to third emission areas PXA1, PXA2, and PXA3 of the pixel unit PXU shown in FIG. 5. The non-emission area NPXA may be an area surrounding the emission area PXA within the display area DA, that is, an area of the display area DA excluding the emission area PXA.

A light emitting layer EML may be patterned from a material layer and disposed in a region corresponding to the emission opening PX-O. The light emitting layer EML may include a material that generates light, such as an inorganic light emitting material or an organic light emitting material. The holes and electrons injected into the light emitting layer EML are combined to form excitons, and as the excitons transition to the ground state, the organic light emitting diode OL may emit light.

The second electrode CE may be disposed on the light emitting layer EML. The second electrodes CE of the pixel units PXU may be electrically connected to each other on a plane and may provide a common voltage to the pixel units PXU.

The encapsulation films EN1, MN and EN2 within an encapsulation layer may be disposed on the light emitting element OL. The encapsulation films EN1, MN, and EN2 may include a first inorganic encapsulation film EN1, an organic encapsulation film MN, and a second inorganic encapsulation film EN2. The first inorganic encapsulation film EN1 and the second inorganic encapsulation film EN2 may protect the light emitting element OL from moisture and/or oxygen. The organic encapsulation film MN may protect the light emitting element OL from foreign substances such as dust particles. However, the laminated structure of the encapsulation films EN1, MN, and EN2 is not limited to any one as long as it may seal and protect the light emitting element OL or improve light emission efficiency.

An opening area OPA may be defined in the base layer BL and in the first to seventh insulating layers 10 to 70. The opening area OPA may be defined inside the display area DA and may correspond to a portion or area of the non-emission area NPXA. The opening area OPA may be defined extended through the base layer BL and through the first to seventh insulating layers 10 to 70. The opening area OPA may be open at both an upper surface and a lower surface of the display panel DP. The opening area OPA may be an enclosed opening in the plan view, which is defined by one or more layers of the display panel DP.

A pixel defining film PDL may be opened or disconnected corresponding to the opening area OPA. That is, the pixel defining film PDL may not overlap the opening area OPA. That is, a solid portion of the pixel defining layer (e.g., the pixel defining film PDL) may be excluded from the opening area OPA.

The opening area OPA corresponds to an area between the pixel units PXU and may separate the pixel units PXU from each other. For example, the pixel units PXU arranged along one direction along the display area DA may be spaced apart from each other with an opening area OPA therebetween. According to an embodiment, the opening area OPA may surround at least a portion of the pixel units PXU on a plane. Each of the pixel units PXU spaced apart with the opening area OPA therebetween may be islanded.

Referring to FIG. 6, for example, the two opening areas OPA may be disposed on opposing sides of each of the pixel unit PXU which is in the middle of the view. Taking FIGS. 5 and 6 together, for example, the horizontal direction in FIG. 6 may be applied to the first direction DR1 and the second direction DR2 of FIG. 5, without being limited thereto, such that a pixel unit PXU may be islanded by opening areas OPA, where an opening area OPA surrounds the pixel unit PXU. Since the opening area OPA corresponds to the piezoelectric element SD, the surrounding of the pixel units PXU by the opening area OPA may be indicated by the piezoelectric layer PZ, the first electrode line TX and the second electrode line RX in FIG. 5.

As the opening area OPA is defined in the display panel DP, the display panel DP may easily relieve stress when a tensile force is applied to the electronic apparatus ED. That is, stretchability and flexibility of the display panel DP may be improved.

A groove GV adjacent to the pixel unit PXU may be defined in the display panel DP. The groove GV may be defined in at least one of the first to seventh insulating layers 10 to 70 disposed between the base layer BL and the light emitting element OL. FIG. 6 illustratively illustrates a groove GV formed penetrating the fifth to seventh insulating layers 50, 60, and 70 among the first to seventh insulating layers 10 to 70.

Referring to FIG. 6, the groove GV may be open in a direction away from the sound module SM. The groove GV may be an enclosed opening in the plan view, which is defined by one or more layers of the display panel DP. The groove GV may be defined by a sidewall of the fifth to seventh insulating layers 50, 60, and 70. The sidewalls of the fifth and sixth insulating layers 50 and 60 may be aligned with each other (e.g., coplanar with each other).

Each of the groove GV and the opening area OPA may have a center in a direction along the display panel DP. Referring to FIG. 6, the inner surface as a sidewall of the seventh insulating layer 70 may protrude further toward the center of the groove GV than the inner surfaces as respective sidewalls of the fifth and sixth insulating layers 50 and 60, where the sidewalls together define the groove GV. An inner surface of the seventh insulating layer 70 that protrudes further than the inner surface of the sixth insulating layer 60 may form a tip portion of the stack of insulating layers (e.g., the fifth to seventh insulating layers 50, 60, and 70). In an embodiment of a method of providing the display panel DP, the etching ratio between a material of the seventh insulating layer 70 including an inorganic layer and a material of the sixth insulating layer 60 including an organic layer may be different. For this reason, the inner surface of the seventh insulating layer 70 may protrude further than the inner surface of the sixth insulating layer 60 and thereby define the tip by an etching process applied to the insulating layers.

FIG. 6 illustrates the groove penetrating an entire thickness of each of the fifth to seventh insulating layers 50, 60, and 70. However, the insulating layer in which the groove GV is formed is not limited to the illustrated embodiment. For example, the groove GV may be formed through an entirety of the thicknesses of the sixth and seventh insulating layers 60 and 70 and may not be formed or extended into the fifth insulating layer 50, or may be formed by completely penetrating the thicknesses of the sixth and seventh insulating layers 60 and 70 and extending into a partial thickness of the fifth insulating layer 50.

The groove GV may be formed on a plane (or on the display area DA) between the light emitting element OL of the pixel unit PXU and the opening area OPA which is adjacent to the light emitting element OL. That is, the groove GV may be formed in a region between the emission area PXA and the opening area OPA in the pixel unit PXU on a plane. According to an embodiment, the groove GV may surround at least a portion of the pixel unit PXU on a plane. That is, the groove GV may extend along an outer edge of the pixel unit PXU, in directions along the plane defined by the first direction DR1 and the second direction DR2 crossing each other, to surround a pixel unit PXU.

Referring to FIG. 6, for example, two groove portions are disposed on opposing sides of a light emitting element OL for each of the left, middle and right light emitting elements OL. The two groove portions may be portions of a same groove GV, without being limited thereto. Taking FIGS. 5 and 6 together, for example, the horizontal direction in FIG. 6 may be applied to the first direction DR1 and the second direction DR2 of FIG. 5, without being limited thereto, such that a light emitting element OL (or a pixel unit PXU) may be surrounded by a same groove GV. Since the opening area OPA corresponds to the piezoelectric element SD, the surrounding of the pixel units PXU by the opening area OPA may be indicated by the piezoelectric layer PZ, the first electrode line TX and the second electrode line RX in FIG. 5

A first inorganic encapsulation film EN1 is deposited on the light emitting element OL, the pixel defining film PDL, and the groove GV to protect the light emitting element OL and the transistors T1 and T2 from inflow of moisture or oxygen. In an embodiment of a method of providing the display panel DP, flow along the first inorganic encapsulation film EN1 of a material for forming the organic encapsulation film MN may be controlled by the groove GV. The material for forming the organic encapsulation film MN may fill the groove GV which is lined with the first inorganic encapsulation film EN1, and may be prevented from overflowing into the opening area OPA by the groove GV. Therefore, the material for forming the organic encapsulation film MN may not extend further than the pixel unit PXU to overlap the opening area OPA.

The second inorganic encapsulation film EN2 may be disposed on the organic encapsulation film MN. The second inorganic encapsulation film EN2 seals the organic encapsulation film MN together with the first inorganic encapsulation film EN1, and moisture or oxygen may be prevented from being introduced into the light emitting element OL and the transistors T1 and T2 through the organic encapsulation film MN.

A plurality of grooves GV may be provided in the display panel DP to correspond to the islanded pixel units PXU. On a plane, a discrete or individual one of the grooves GV may be formed surrounding at least a portion of a corresponding pixel unit PXU among the pixel units PXU. As the grooves GV are formed for each pixel unit PXU among those spaced apart from each other, encapsulation films EN1, MN, and EN2 may also be formed to encapsulate the spaced apart pixel units PXU, respectively.

Referring to FIG. 6, a pattern of the encapsulation layer including the encapsulation films EN1, MN, and EN2 together with each other, may contact an underlying layer or module (e.g., the sound module SM), to effectively encapsulate the pixel units PXU which are spaced apart from each other. In an embodiment, for example, the display panel DP includes a plurality of encapsulation layers (e.g., patterns including the encapsulation films EN1, MN, and EN2 together with each other) which respectively cover the plurality of pixel units PXU and are non-overlapping with the opening area OPA. As being in contact, elements may form an interface therebetween, without being limited thereto.

The display panel DP may further include a spacer SPC disposed on the pixel defining film PDL. The spacer SPC may be disposed on a portion of the pixel defining film PDL which is adjacent to (or closest to) the opening area OPA. A sidewall of the spacer SPC may contribute to defining the opening area OPA. In an embodiment of a method of providing a display panel DP, the spacer SPC may control the flow of the material for forming the organic encapsulation film MN together with the groove GV and prevent the organic encapsulation film MN from being disposed further than the pixel unit PXU and in the opening area OPA.

The sound module SM may be disposed below the display panel DP. For example, the sound module SM may be disposed under the base layer BL of the display panel DP. The sound module SM may be a piezoelectric speaker provided in the form of a thin film. The sound module SM may include a base part ELA as a second base layer of the electronic apparatus ED, and piezoelectric elements SD disposed inside the base part ELA. Each of the piezoelectric elements SD may include a first electrode line TX, a piezoelectric layer PZ, and a second electrode line RX that overlap each other on a plane.

The base part ELA may cover the piezoelectric elements SD. Specifically, the base part ELA may cover the first electrode line TX, the piezoelectric layer PZ, and the second electrode line RX. The base part ELA may overlap the opening area OPA and may be disposed under the base layer BL to support the base layer BL having the opening area OPA. In an embodiment, the base part ELA may substantially correspond to the display area DA, such as being disposed corresponding to the emission areas PXA as well as in the opening area OPA.

The base part ELA transmits vibrations of the piezoelectric elements SD and may include a material having flexibility. For example, the base part ELA may include organic materials, such as polydimethylsiloxane (PDMS), polyethylene terephthalate (PET), polyurethane (PU), and polyimide (PI). However, the material of the base part ELA is not limited to the above example.

The first electrode line TX and the second electrode line RX may extend along directions crossing each other and overlap each other on a plane. A piezoelectric layer PZ may be disposed between the first electrode line TX and the second electrode line RX. The piezoelectric layer PZ may be disposed at an intersection where the first electrode line TX and the second electrode line RX overlap. The first electrode line TX, the piezoelectric layer PZ, and the second electrode line RX overlapping each other along the thickness direction of the electronic apparatus ED may together define the piezoelectric element SD, and an area where the piezoelectric element SD is disposed may be defined as a sound area SA of the display area DA.

The first electrode line TX and the second electrode line RX may be respectively disposed under and above the piezoelectric layer PZ to apply electrical signals to the piezoelectric layer PZ. The piezoelectric layer PZ may output sound by converting electrical signals into physical vibrations.

The first electrode line TX and the second electrode line RX may include a material having flexibility and conductivity. For example, the first electrode line TX and the second electrode line RX are may include a flexible organic material with good electrical conductivity, such as PEDOT:PSS (poly(3,4-ethylenedioxythiophene):poly(styrenesulfonate), graphene, and one or more of a carbon nanotube (CNT), organic/inorganic complex materials containing inorganic materials in organic materials, or metallic materials such as a metal nanowire or a liquid metal whose melting point is close to room temperature. However, the material of the first electrode line TX and the second electrode line RX is not limited to the above example. As the first electrode line TX and the second electrode line RX have flexibility and conductivity, an electrical signal may be applied to the piezoelectric layer PZ, and damage may be prevented when stress such as tensile force is applied to the electronic apparatus ED at the same time.

The piezoelectric layer PZ has a polycrystalline structure and may include a piezoelectric material that converts electrical signals into vibrations. The piezoelectric layer PZ may include a polycrystalline or single crystal piezoelectric material, or an organic piezoelectric material. For example, piezoelectric materials, such as polyvinylidene fluoride (PVDF), lead zirconate titanate (PZT), graphene, zinc oxide (ZnO) nanoparticles, and a combination thereof such as composite materials thereof, may be included. The material of the piezoelectric layer PZ is not limited to any one as long as it may convert an electrical signal into vibration.

The piezoelectric elements SD of the sound module SM may be disposed in the display area DA. Each of the piezoelectric elements SD may be disposed to overlap the opening area OPA. That is, the piezoelectric elements SD may be disposed between the pixel units PXU on a plane. The piezoelectric elements SD may not overlap the light emitting elements OL of the pixel units PXU. That is, the piezoelectric elements SD may not overlap the emission areas PXA, such as to be spaced apart from the emission areas PXA.

As the piezoelectric elements SD are disposed not to overlap the pixel units PXU, influence on the light emission efficiency of the pixel units PXU may be prevented. In addition, as the piezoelectric elements SD are disposed to correspond to the opening area OPA of the display panel DP, output effects of sound and/or vibration may be improved.

As the display panel DP has an opening area OPA between the pixel units PXU, variously across an entirety of the display area DA, the degree of freedom of arrangement of the piezoelectric elements SD disposed to overlap the opening area OPA may be improved. Also, the piezoelectric elements SD may be uniformly disposed over the entire area of the display area DA without degrading the resolution of the display panel DP. Through this, the electronic apparatus ED may have an improved sound effect while the area of the display area DA is enlarged. In addition, the electronic apparatus ED may give a vibration effect to one or more of a position where sound is actually generated and provide realistic sound.

An electronic apparatus ED according to an embodiment of the invention may include a display panel DP in which an opening area OPA corresponding to an area between pixel units PXU is defined on a display area DA, and piezoelectric elements SD of the sound module SM arranged to overlap the opening area OPA.

By overlapping the piezoelectric elements SD in the display area DA, the degree of freedom of placement of sound-generating (or vibration-generating) elements in the electronic apparatus ED may be improved. In addition, by uniformly disposing piezoelectric elements SD within the display area DA without being limited to a specific area, a vibration effect may be applied to both an actual location where sound is generated and an area immediately adjacent to the actual location, and a realistic sound effect may be provided.

Although the embodiments of the invention have been described, it is understood that the invention should not be limited to these embodiments but various changes and modifications may be made by one ordinary skilled in the art within the spirit and scope of the invention as hereinafter claimed.

What is claimed is:

1. An electronic apparatus comprising:

a display panel including:

pixel units each comprising a transistor and a light emitting element electrically connected to each other, arranged in a display area, and an opening area non-overlapping the pixel units within the display area; and a sound module including piezoelectric elements overlapping the opening area in the display area and non-overlapping the pixel units, within the display area.

2. The electronic apparatus of claim 1, wherein each of the piezoelectric elements comprises:

a first electrode line;

a second electrode line disposed on the first electrode line; and a piezoelectric layer disposed between the first electrode line and the second electrode line.

3. The electronic apparatus of claim 2, wherein each of the first electrode line and the second electrode line comprises at least one of poly(3,4-ethylenedioxythiophene):poly(styrenesulfonate), graphene, a carbon nanotube, a metal nanowire and a liquid metal material.

4. The electronic apparatus of claim 2, wherein the piezoelectric layer comprises at least one of polyvinylidene fluoride, lead zirconate titanate, graphene, zinc oxide, and a combination thereof.

5. The electronic apparatus of claim 2, wherein the sound module further comprises a base part disposed under the display panel and covering the piezoelectric elements.

6. The electronic apparatus of claim 5, wherein the base part comprises at least one of polydimethylsiloxane, polyethylene terephthalate, polyurethane, and polyimide.

7. The electronic apparatus of claim 2, wherein the piezoelectric elements are arranged along a first direction and a second direction which crosses the first direction within the display area, wherein each of the first electrode line and the second electrode line is provided in plurality and disposed non-overlapping the pixel units within the display area, wherein the first electrode lines extend along the first direction and are arranged along the second direction, wherein the second electrode lines extend along the second direction and are arranged along the first direction.

8. The electronic apparatus of claim 7, wherein the piezoelectric layer of each of the piezoelectric elements is disposed corresponding to overlapping portions of the first electrode lines and the second electrode lines.

9. The electronic apparatus of claim 1, wherein the display panel comprises:

a base layer disposed on the sound module;

the transistor disposed on the base layer;

the light emitting element disposed on the transistor; and insulating layers disposed between the base layer and the light emitting element, wherein the opening area is defined through the base layer and the insulating layers.

10. The electronic apparatus of claim 9, wherein the display panel further comprises grooves defined through at least one of the insulating layers, and the grooves surround the pixel units, respectively.

11. The electronic apparatus of claim 10, wherein the display panel further comprises encapsulation films covering the pixel units, respectively, wherein the encapsulation films are non-overlapping in the opening area.

12. The electronic apparatus of claim 11, wherein the encapsulation films are disposed in the grooves, respectively.

13. The electronic apparatus of claim 1, wherein the light emitting element included in each of the pixel units is provided in plurality, wherein the light emitting elements comprise first to third light emitting elements that output light of different colors from each other.

14. An electronic apparatus comprising:

a base layer including a display area in which an opening area is defined;

pixel units each including a light emitting element, the pixel outputs spaced apart from each other on the display area with the opening area non-overlapping the pixel units;

insulating layers disposed between the base layer and the light emitting element; and a sound module disposed under the base layer, wherein the sound module comprises:

a base part supporting the base layer; and piezoelectric elements disposed inside the base part to overlap the opening area, wherein grooves are defined in at least one of the insulating layers, and the grooves surround the pixel units, respectively.

15. The electronic apparatus of claim 14, wherein the opening area is defined through the base layer and the insulating layers.

16. The electronic apparatus of claim 15, wherein the piezoelectric elements are arranged along a first direction and a second direction crossing the first direction between the pixel units on the display area.

17. The electronic apparatus of claim 16, wherein each of the piezoelectric elements comprises:

a first electrode line;

a second electrode line disposed on the first electrode line; and a piezoelectric layer disposed between the first electrode line and the second electrode line.

18. The electronic apparatus of claim 17, wherein each of the first electrode line and the second electrode line comprises at least one of poly(3,4-ethylenedioxythiophene):poly (styrenesulfonate), graphene, a carbon nanotube, a metal nanowire, and a liquid metal material.

19. The electronic apparatus of claim 17, wherein the piezoelectric layer comprises at least one of polyvinylidene fluoride, lead zirconate titanate, graphene, zinc oxide and a combination thereof.

20. The electronic apparatus of claim 14, wherein the base part comprises at least one of polydimethylsiloxane, polyethylene terephthalate, polyurethane, and polyimide.

* * * * *